(12) United States Patent
Nätti

(10) Patent No.: US 9,761,362 B2
(45) Date of Patent: Sep. 12, 2017

(54) MAGNET AND METHOD FOR HANDLING METAL SHEETS

(71) Applicant: Ixtur Oy, Piikkio (FI)

(72) Inventor: Reijo Nätti, Littoinen (FI)

(73) Assignee: Ixtur Oy, Piikkiö (FI)

( * ) Notice: Subject to any disclaimer, the term of this patent is extended or adjusted under 35 U.S.C. 154(b) by 0 days.

(21) Appl. No.: 15/115,700

(22) PCT Filed: Jan. 14, 2015

(86) PCT No.: PCT/FI2015/050019
§ 371 (c)(1),
(2) Date: Aug. 1, 2016

(87) PCT Pub. No.: WO2015/114203
PCT Pub. Date: Aug. 6, 2015

(65) Prior Publication Data
US 2017/0011832 A1    Jan. 12, 2017

(30) Foreign Application Priority Data

Jan. 30, 2014  (FI) .................................. 20145100
Jan. 30, 2014  (FI) .................................. 20145101
Jan. 30, 2014  (FI) .................................. 20145103

(51) Int. Cl.
*H01F 7/20*      (2006.01)
*H01F 7/02*      (2006.01)
(Continued)

(52) U.S. Cl.
CPC .......... *H01F 7/0226* (2013.01); *B25B 11/002* (2013.01); *G01D 5/14* (2013.01);
(Continued)

(58) Field of Classification Search
CPC ........ H01F 7/22; H01F 7/0257; H01F 7/0226; H01H 51/22; G01R 33/07; G01R 33/096
(Continued)

(56) References Cited

U.S. PATENT DOCUMENTS 2,915,682 A    12/1959  Bower
2,947,921 A     8/1960  Watelet
(Continued)

FOREIGN PATENT DOCUMENTS

DE    3029720 C1    8/1982
DE    19951703 A    5/2001
(Continued)

OTHER PUBLICATIONS

Finnish Patent and Registration Office Search report of priority application No. 20145100, dated Sep. 29, 2014.
(Continued)

*Primary Examiner* — Shawki S Ismail
*Assistant Examiner* — Lisa Homza
(74) *Attorney, Agent, or Firm* — Berggren, Inc.

(57) ABSTRACT

The present invention relates to a magnet, which comprises a body and a slide that is movably arranged inside a cavity of the body. The slide that comprises a permanent magnet is moved relative to the body by transferring a medium into and out of the cavity. The invention also relates to a method for handling metal sheets.

22 Claims, 4 Drawing Sheets

(51) Int. Cl.

| | |
|---|---|
| *H01F 7/04* | (2006.01) |
| *B25B 11/00* | (2006.01) |
| *G01D 5/14* | (2006.01) |
| *G01R 33/07* | (2006.01) |
| *G01R 33/09* | (2006.01) |

(52) U.S. Cl.
CPC .......... *G01R 33/07* (2013.01); *G01R 33/096* (2013.01); *H01F 7/0252* (2013.01); *H01F 7/0257* (2013.01); *H01F 7/04* (2013.01)

(58) Field of Classification Search
USPC .......................................... 335/285
See application file for complete search history.

(56) References Cited

U.S. PATENT DOCUMENTS

| | | | | |
|---|---|---|---|---|
| 3,079,191 | A | * | 2/1963 | Engelsted ............. H01F 7/0257 269/8 |
| 3,109,967 | A | | 11/1963 | Churchill |
| 3,179,858 | A | | 4/1965 | Binder et al. |
| 3,503,024 | A | | 3/1970 | Iwasaki |
| 3,912,887 | A | * | 10/1975 | Gratz ....................... H01H 1/36 200/16 D |
| 4,121,865 | A | | 10/1978 | Littwin, Sr. |
| 4,494,098 | A | | 1/1985 | Haneda et al. |
| 6,512,435 | B2 | | 1/2003 | van Namen |
| 2002/0158727 | A1 | * | 10/2002 | Namen ................... E05B 47/00 335/78 |
| 2011/0248804 | A1 | * | 10/2011 | Wygnanski ........... H01F 7/1646 335/230 |
| 2014/0355644 | A1 | * | 12/2014 | Gupta ..................... G01K 7/38 374/4 |

FOREIGN PATENT DOCUMENTS

| | | |
|---|---|---|
| EP | 1541255 A1 | 6/2005 |
| EP | 2085349 A1 | 8/2009 |
| GB | 874600 A | 8/1961 |
| JP | 2009039849 A | 2/2009 |
| JP | 2009135411 A | 6/2009 |
| WO | 2012160262 A1 | 11/2012 |

OTHER PUBLICATIONS

Finnish Patent and Registration Office Search report of priority application No. 20145101, dated Sep. 29, 2014.

Finnish Patent and Registration Office Search report of priority application No. 20145103, dated Sep. 30, 2014.

European Patent Office Search report of international applicaiton No. PCT/FI2015/050019, dated Mar. 26, 2015.

* cited by examiner

MAGNET AND METHOD FOR HANDLING METAL SHEETS

PRIORITY

This application is a U.S. national application of the international application number PCT/FI2015/050019 filed on Jan. 14, 2015 and claiming priority of Finnish national applications FI20145100, FI20145101 and FI20145103 all of which were filed on Jan. 30, 2014. The contents of the international application PCT/FI2015/050019 as well as the three national applications FI20145100, FI20145101 and FI20145103 are incorporated herein by reference.

TECHNICAL FIELD OF THE INVENTION

The present invention relates to a magnet and to a method for handling metal sheets according to the preambles of the appended independent claims.

BACKGROUND OF THE INVENTION

Magnets are used in many fields of technology to perform various operations, such as to control motion, to switch electrical circuits and to move objects. A magnet is typically provided with a certain functionality to change its magnetic state. A magnet may comprise, for example, a coil which produces a magnetic field that is dependent on the amount and the direction of the electric current supplied to the coil. The coil may be used alone, or it can be combined with a permanent magnet, whereby the coil is used to increase or decrease the magnetic field produced by the permanent magnet. Alternatively, a magnet may comprise a movable part, the position of which determines the magnetic state of the magnet. The movable part, which comprises a permanent magnet, is moved relative to a body of the magnet, for example, with a magnetic force produced by a coil that is arranged to encircle the movable part.

An example of a magnet that comprises a movable part for changing the magnetic state of the magnet is disclosed in the document WO 2012/160262. The magnet of the document WO 2012/160262 is a so-called bi-stable magnet, wherein the movable part, which comprises a permanent magnet, is arranged to be movable relative to a body of the magnet between two stable positions. In the first position, the movable part is in contact with the body, whereby the magnetic flux generated by the permanent magnet may be directed through the body to an object to be attached. In the second position, the movable part is separated from the body so that the flow of the magnetic flux in the body is significantly reduced and thus the holding force of the magnet is negligible. The body of the magnet comprises a coil that is arranged around the movable part. The movable part is moved between the two positions by supplying a sufficient amount of electric current through the coil in a suitable direction.

A problem associated with the magnet of the document WO 2012/160262 relates to the bi-stability of the magnet. The magnet can only be in either of its two states and the state of the magnet is changed by moving the movable part from one stable position to the other. Consequently, the holding force of the magnet that is dependent on the position of the movable part has only two fixed values. In other words, the holding force of the magnet of the document WO 2012/160262 cannot be adjusted, which reduces the applicability of the magnet.

Another problem associated with the magnet of the document WO 2012/160262 relates to the second position of the movable part, i.e. to the position wherein the movable part is not in contact with the body. In order to make sure that the movable part stays in its second position, either electric current must constantly be supplied to the coil, or the magnet must be provided with springs or other suitable means to push the movable part towards the second position. In the first case, a disadvantage is the power consumption of the coil, whereas in the second case, a disadvantage is the complicated structure, which may easily be damaged, thus resulting in a malfunction of the magnet.

OBJECTIVES OF THE INVENTION

It is the main objective of the present invention to reduce or even eliminate prior art problems presented above.

It is an objective of the present invention to provide a magnet that has stable magnetic states at which the magnet does not consume energy. It is also an objective of the invention to provide a magnet, whose magnetic state can be changed easily using very little energy. It is a further objective of the invention to provide a magnet, whose holding force can be adjusted steplessly and which enables to maintain the holding force at a desired value with very little energy.

It is a further objective of the invention to provide a magnet having a structure that enables to achieve a large holding force with a small size. It is still a further objective of the invention to provide a magnet that has a simple structure, low manufacturing costs, a long life expectancy and a great reliability.

It is also an objective of the present invention to provide a method for handling metal sheets. In more detail, it is an objective of the invention to provide a method enabling to lift a desired number of metal sheets from a stack of metal sheets.

In order to realise the above-mentioned objectives, the magnet and the method according to the invention are characterised by what is presented in the characterising parts of the appended independent claims. Advantageous embodiments of the invention are described in the dependent claims.

DESCRIPTION OF THE INVENTION

A typical magnet according to the invention comprises:
a body that comprises a first and a second section made of magnetic material for directing magnetic flux to an object to be attached, the first and the second section being separated and attached to a third section of the body, which third section is made of non-magnetic material, and
a slide that comprises a permanent magnet, and a first and a second pole piece attached to opposite magnetic pole surfaces of the permanent magnet, the slide being arranged to be movable relative to the body between a first and a second position in order to alter the path of the magnetic flux generated by the permanent magnet.

In a typical magnet according to the invention:
the first section comprises a through hole having a first and a second through hole portion, the diameter of the first through hole portion being smaller than the diameter of the second through hole portion,
a first end of the through hole is closed by a fourth section of the body and a second end of the through hole is closed by the second and the third section of the body, so that a cavity consisting of a first and a second cavity portion is formed inside the body, the slide is arranged inside the cavity so as to be movable in the longitudinal direction of the through hole, the first pole piece being directed towards the first end of the through hole, and the magnet comprises means for transferring a medium into and out of the first and the second cavity portion in order to move the slide;

wherein at the first position of the slide, the permanent magnet, at least part of the first pole piece and at least part of the second pole piece are located inside the first through hole portion, and at the second position of the slide, at least part of the first pole piece is located inside the first through hole portion and the second pole piece is located outside the first through hole portion.

The magnet according to the invention is an attachment magnet, the magnetic state of which can be changed by moving the slide relative to the body between the first and the second position. The slide is moved by transferring a medium into and out of the cavity inside which the slide is movably arranged. The first and the second position are stable positions at which the slide stays still with the help of the magnetic field produced by the permanent magnet. At the first position of the slide, the magnetic flux generated by the permanent magnet is short-circuited by the first section. At the second position of the slide, the magnetic flux is conducted through the first and the second section to an object that closes the magnetic circuit.

The holding force of the magnet depends on the position of the slide. The holding force is at its minimum when the slide is at the first position, and at its maximum when the slide is at the second position. Because the slide can be positioned to any position between the first and the second position, the holding force of the magnet can be adjusted steplessly. The holding force can be increased by moving the slide towards the second position, and decreased by moving the slide towards the first position.

At the first position of the slide, the permanent magnet, at least part of the first pole piece and at least part of the second pole piece are located inside the first through hole portion. The first pole piece and the second pole piece can thus be located partly or completely inside the first through hole portion. Preferably, the first pole piece and the second pole piece are in contact or nearly in contact with the wall of the first through hole portion.

When the slide is at the first position, the magnetic flux generated by the permanent magnet is essentially short-circuited by the first section, which means that the magnetic flux flows from one pole piece to the other mainly through the part of the first section that surrounds the first through hole portion. The first position of the slide is a position to which the magnetic force of the permanent magnet actively pulls the slide, when the permanent magnet is inside the first through hole portion. When the slide is moved away from the first position towards the second position, the permanent magnet produces a counterforce that works against the moving force and tries to pull the slide back to the first position. At the first position of the slide, the magnetic flux is mainly directed from one pole piece to the first section and from the first section to the other pole piece in a direction, which is essentially perpendicular to the wall of the first through hole portion.

At the second position of the slide, at least part of the first pole piece is located inside the first through hole portion and the second pole piece is located outside the first through hole portion. Preferably, at the second position of the slide, also the permanent magnet is located outside the first through hole portion. At the second position of the slide, the second pole piece is preferably in contact or nearly in contact with the second section, so that the magnetic flux is efficiently conducted between the second pole piece and the second section. Preferably, at the second position of the slide the first pole piece is in contact or nearly in contact with the wall of the first through hole portion.

When the slide is at the second position, the magnetic flux generated by the permanent magnet may flow through the first and the second section to an object to be attached. The object that is arranged in contact with both the first and the second section closes the magnetic circuit, whereby magnetic flux is conducted from one pole piece to the other through the first and the second section and the object. At the second position of the slide, the magnetic flux is mainly directed between the first pole piece and the first section in a direction essentially perpendicular to the wall of the first through hole portion, and between the second pole piece and the second section in a direction essentially perpendicular to the bottom of the slide. The direction of the magnetic flux to/from the second pole piece is thus turned by about 90 degrees between the first and the second position of the slide.

The slide is moved relative to the body by transferring medium that can be gas or liquid into and out of the first and the second cavity portion. The slide can be moved towards the second position by transferring medium into the first cavity portion and out of the second cavity portion. The slide can be moved towards the first position by transferring medium into the second cavity portion and out of the first cavity portion.

The cavity of the body is defined by the first, the second, the third and the fourth section. The cavity is divided into the first cavity portion and the second cavity portion by a region where the first through hole portion and the second through hole portion meet each other. The first cavity portion is preferably defined by the wall of the first through hole portion and by the fourth section. The second cavity portion is preferably defined by the wall of the second through hole portion, and by the second and the third section.

The first and the second section of the body are separated from each other by the third section. Because the third section is made of non-magnetic material, the first and the second section are magnetically separated, so that the flow of the magnetic flux directly between the first and the second section is essentially prevented.

The through hole of the first section comprises two through hole portions, which are located consecutively in the longitudinal direction of the through hole. The first through hole portion is closed by the fourth section, and the second through hole portion by the second and the third section. The diameter of the second through hole portion is larger than the diameter of the first through hole portion, so that the short-circuiting of the magnetic flux through the first section can be essentially prevented, when the slide is at the second position. The length of the first through hole portion is preferably longer than the longitudinal movement of the slide.

The slide is movably arranged inside the cavity in such a manner that at least part of the first pole piece always stays inside the first through hole portion. The movement of the slide is thus mechanically supported by the wall of the first through hole portion. Preferably, the slide stays in contact with the wall of the first through hole portion in all positions of the slide.

The slide has a sandwich structure, wherein the permanent magnet is arranged between the first and the second pole piece. The first pole piece and the second pole piece are attached to different poles of the permanent magnet and are made of magnetic material so that the magnetic flux generated by the permanent magnet may be conducted through them. Magnetic material of the first and the second pole piece is ferromagnetic material, preferably iron. The permanent magnet can be, for example, a neodymium magnet, an alnico magnet or a samarium-cobalt magnet.

The sections of the body may have various shapes and sizes, and they can be formed of one or more parts. The first, the second and the third section can be arranged within each other in such a manner that the first section surrounds the third section, which surrounds the second section. The third section can be a sleeve that is attached to the wall of the second through hole portion. The second section can be a cylinder that is arranged inside the third section. The first and the second section are made of magnetic material that is suitable for conducting magnetic flux. Magnetic material of the first and the second section is ferromagnetic material, such as iron, nickel, cobalt or their alloys. The first section and the second section are preferably made of the same material. The third section is made of non-magnetic material, which can be paramagnetic material, such as resin, brass or aluminium, or diamagnetic material, such as acid-proof steel or stainless steel. The fourth section that closes the first end of the through hole (i.e. the first through hole portion) is attached to the first section. The fourth section can be made of magnetic or non-magnetic material. The fourth section can be made of the same material as the first section.

According to an embodiment of the invention the first through hole portion and the first pole piece are cylindrical. Preferably, the diameter of the first pole piece is only slightly smaller than the diameter of the first through hole portion, whereby the wall of the first through hole portion can efficiently support the slide while it is moved between the first and the second position. The diameter of the first through hole portion can be, for example, less than 10 mm, 10-50 mm, 50-200 mm or 200-500 mm. The diameter of the first pole piece can be, for example, less than 2 mm, less than 1 mm, less than 0.5 mm, less than 0.1 mm, less than 0.01 mm or 0.005-0.5 mm smaller than the diameter of the first through hole portion.

According to an embodiment of the invention the second pole piece is cylindrical. Preferably, the second pole piece has the same diameter as the first pole piece.

According to an embodiment of the invention the permanent magnet comprises a plurality of magnet pieces arranged in one or more layers. The permanent magnet can, for example, be formed of sector pieces arranged in one layer in such a manner that the same poles of the sector pieces are disposed on the same side of the permanent magnet. The number of sector pieces can be, for example, 2, 3, 4-6 or 7-10. The permanent magnet can alternatively be formed of magnet pieces arranged one on the other. The magnet pieces can be arranged one on the other in such a manner that ferromagnetic discs are arranged between the magnet pieces and the different poles of the magnet pieces are arranged to face each other.

According to an embodiment of the invention the thickness of the permanent magnet is smaller than the thickness of the first pole piece and the thickness of the second pole piece. The use of thicker pole pieces prevents the magnetic flux from saturating.

According to an embodiment of the invention the permanent magnet is cylindrical and the diameter of the permanent magnet is smaller than the diameter of the first pole piece and the diameter of the second pole piece. The smaller diameter of the permanent magnet prevents the permanent magnet from touching the wall of the first through hole portion.

According to an embodiment of the invention the slide is cylindrical. Preferably, the diameter of the slide is only slightly smaller than the diameter of the first through hole portion, whereby the wall of the first through hole portion can efficiently support the slide while it is moved between the first and the second position. The diameter of the first through hole portion can be, for example, less than 10 mm, 10-50 mm, 50-200 mm or 200-500 mm. The diameter of the slide can be, for example, less than 2 mm, less than 1 mm, less than 0.5 mm, less than 0.1 mm, less than 0.01 mm or 0.005-0.5 mm smaller than the diameter of the first through hole portion. The length of the slide can be, for example, less than 3 mm, 3-10 mm, 10-100 mm or 100-500 mm.

According to an embodiment of the invention the second through hole portion is cylindrical. The diameter of the second through hole portion can be, for example, 0.5-2 mm, 1-5 mm, 2-10 mm, 5-50 mm or 25-300 mm larger than the diameter of the first through hole portion.

According to an embodiment of the invention the third section is a hollow cylinder attached to the wall of the second through hole portion, and the second section is attached to the inner wall of the third section. The second section is preferably cylindrical.

According to an embodiment of the invention the inner diameter of the third section is the same or larger than the diameter of the first through hole portion, and the height of the third section is larger than the height of the second section.

According to an embodiment of the invention the second and the third section are located inside the second through hole portion.

According to an embodiment of the invention the third section extends from the second end of the through hole to the first through hole portion. Thus, the third section covers the wall of the second through hole portion.

According to an embodiment of the invention the first section and the fourth section form an integral structure. This structure can be manufactured from one piece of magnetic material by machining.

According to an embodiment of the invention the magnet comprises a sealing ring attached around the slide or attached to the wall of the first through hole portion. The sealing ring divides an airtight space formed by the cavity into two portions and prevents the medium from flowing between said portions. The sealing ring makes it easier to create a sufficient pressure difference and enables moving the slide efficiently. The sealing ring can be made of, for example, silicone, ethylene-propylene, polyurethane, nitrile-butadiene rubber or acetal plastics, or their compounds.

According to an embodiment of the invention the sealing ring is attached to a groove in the first pole piece. The sealing ring is attached to the first pole piece in such a position that the sealing ring stays inside the first through hole portion.

According to an embodiment of the invention the slide comprises a cap attached on top of the first pole piece for holding the sealing ring in place. The cap may comprise a groove in which the sealing ring is installed. The groove is preferably arranged near the end of the cap that is attached to the first pole piece. The groove may be located between the cap and the first pole piece. The cap can be made of magnetic or non-magnetic material.

According to an embodiment of the invention the means for transferring a medium into and out of the first and the second cavity portion comprises a first and a second conduit integrated into the body, a first end of the first conduit being in communication with the first cavity portion and a first end of the second conduit being in communication with the second cavity portion. Medium can be transferred into and out of the first cavity portion and the second cavity portion through the first conduit and the second conduit, respectively. Preferably, the first end of the first conduit is arranged to the first end of the through hole, and the first end of the second conduit is arranged to the second end of the through hole. Second ends of the conduits may be in communication with each other so that the medium that has been transferred out of one cavity portion can be transferred into the other cavity portion. The magnet may comprise a plurality of first and second conduits. The number of the first and the second conduits can be, for example, 2-4, 5-10 or 10-30.

According to an embodiment of the invention a second end of the first conduit and a second end of the second conduit open outside the magnet. The first and the second conduit thus extend through the body.

According to an embodiment of the invention the means for transferring a medium into and out of the first and the second cavity portion comprises a pneumatic or a hydraulic system coupled to the second end of the first conduit and the second end of the second conduit.

According to an embodiment of the invention the means for transferring a medium into and out of the first and the second cavity portion comprises a pump coupled to the second end of the first conduit and the second end of the second conduit. The pump can be configured to transfer medium in two directions, whereby the medium can be transferred from the first cavity portion into the second cavity portion, and vice versa. The means for transferring a medium into and out of the first and the second cavity portion may comprise two pumps, the first pump being coupled to the second end of the first conduit and the second pump being coupled to the second end of the second conduit. Depending on the type of the medium, the pump can be a hydraulic pump or a pneumatic pump, such as a piston pump, a screw pump or a gear pump. It is also possible to use an existing hydraulic or pneumatic system coupled to the second ends of the conduits for transferring the medium into and out of the cavity portions.

According to an embodiment of the invention the means for transferring a medium into and out of the first and the second cavity portion comprises a first pipe coupled between the pump and the second end of the first conduit, and a second pipe coupled between the pump and the second end of the second conduit.

According to an embodiment of the invention the magnet comprises a medium that is gas or liquid. A suitable gas for the magnet is, for example, air. Suitable liquids for the magnet are, for example, oil and water. Preferably, the liquid that is used also functions as a lubricant, reducing the friction between the slide and the wall of the first through hole portion.

According to an embodiment of the invention the magnet comprises a magnetic flux sensor configured to measure magnetic flux density in the first section, and means for determining the position of the slide based on the measured magnetic flux density. By a magnetic flux sensor it is meant a transducer that varies its output voltage and/or current in response to magnetic flux density. Since the path of the magnetic flux in the first section is dependent on the position of the slide, the position of the slide can be determined from the output voltage and/or current of the magnetic flux sensor. The means for determining the position of the slide may comprise, for example, a comparator circuit for providing, as a response to the output voltage and/or current of the magnetic flux sensor, an output signal identifying whether the slide is at the first or the second position. The magnetic flux sensor may also be configured to indicate the position of the slide directly as a binary output. The magnetic flux sensor may also be used to detect whether an object is attached to the magnet or not. The magnetic flux sensor can be, for example, arranged inside the first section, or attached on its surface.

The magnet may comprise a plurality of magnetic flux sensors, which are configured to measure magnetic flux densities in different spatial locations and/or directions. The magnetic flux sensors can be configured to measure magnetic flux densities in orthogonal and/or opposite directions. The number of magnetic flux sensors can be, for example, 2, 3, or more than 3.

According to an embodiment of the invention the magnetic flux sensor is one of the following: a Hall sensor, an AMR magnetometer, a MEMS sensor or reed relay.

According to an embodiment of the invention the slide comprises a guiding rod extending to a bore in the second section. The guiding rod, which extends in the longitudinal direction of the through hole, may be arranged to extend partly or completely through the slide. The guiding rod is preferably dimensioned in such a manner that part of the guiding rod stays in the bore all the time. The purpose of the guiding rod is to reduce the movement of the slide in other directions than the longitudinal direction of the through hole. The guiding rod is made of non-magnetic material, which can be paramagnetic material, such as resin, brass or aluminium, or diamagnetic material, such as acid-proof steel or stainless steel.

According to an embodiment of the invention the magnet comprises a coil attached to the body, the coil being configured to generate a magnetic force that increases or decreases the holding force of the magnet depending on the direction of electric current that is supplied to the coil. The coil is preferably arranged inside the third section in such a manner that the coil encircles the slide at least partly, when the slide is at the second position. Preferably, the coil is used to change the holding force of the magnet, when the slide is at its second position.

According to an embodiment of the invention the magnet comprises means for supplying electric current to the coil. The means for supplying electric current may comprise, for example, a battery that is connected to the coil via a control unit. The control unit is configured to control the amount and the direction of electric current supplied to the coil. The control unit may comprise one or more operating switches for using the magnet, and/or a wireless receiver for receiving control commands from a remote controller. The control unit may also comprise one or more indicator lights for indicating the status of the magnet, and/or a wireless transmitter for transmitting the status information to the remote controller.

According to an embodiment of the invention the coil is configured to generate a magnetic force for moving the slide towards the first or the second position depending on the direction of electric current that is supplied to the coil. The position of the slide can be changed with an electric current pulse that has a certain duration, magnitude and polarity. The duration and the magnitude of the electric current pulse that is needed to move the slide from the first position to the second position, and vice versa are highly dependent of the structure and the size of the magnet. The polarity of the electric current pulse depends on the direction to which the slide needs to be moved. Typically, the duration of the electric current pulse is 30-300 ms.

An advantage of the magnet according to the invention is that the magnet does not consume energy when the slide is at the first or the second position. Another advantage of the magnet is that its magnetic state can be changed easily.

An advantage of the magnet according to the invention is that its holding force is steplessly adjustable and the holding force can be adjusted easily. Another advantage of the magnet is that it consumes very little energy for maintaining the holding force constant.

An advantage of the magnet according to the invention is that it provides a large holding force with a small size. Another advantage of the magnet is its simple structure that makes the magnet very robust and reliable.

An advantage of the magnet according to the invention is that the demagnetization of the permanent magnet can be greatly reduced because the magnetic circuit is closed at the first position of the slide. Another advantage of the magnet is that its holding force is minimal when the magnet is in an OFF state, i.e. when the slide is at the first position.

The magnet according to the invention can be manufactured, for example, as follows. First, a circular groove is machined into the second end of a circular block of magnetic material, the circular groove extending from the second end towards the first end. Next, the circular groove is filled with non-magnetic liquid material, which is hardened into solid form, and a bore, which is concentric with the circular groove, is drilled into the block from its first end towards the second end. The diameter of the bore is at least the inner diameter, but less than the outer diameter of the circular groove. The sum of the depth of the bore and the depth of the circular groove is larger than the thickness of the circular block. Then, a conduit is drilled for the second cavity portion, and a slide is inserted to the bore. And finally, a cover having a conduit for the first cavity portion and being made of non-magnetic material is attached to the first end of the block to cover the bore. The inner part of the machined block corresponds to the second section, the outer part corresponds to the first section, the intermediate part corresponds to the third section and the cover corresponds to the fourth section.

The present invention also relates to a method for handling metal sheets with a magnet according to the invention. A typical method according to the invention comprises placing the magnet according to the invention on an uppermost metal sheet of a stack of metal sheets, increasing the holding force of the magnet by moving the slide towards the uppermost metal sheet, lifting the magnet, and decreasing the holding force of the magnet by moving the slide away from the uppermost metal sheet until a predetermined number of metal sheets remains attached to the magnet.

An advantage of the method according to the invention is that it enables to lift a desired number of metal sheets from a stack of metal sheets. It also enables to detach metal sheets from the magnet one by one.

According to an embodiment of the invention the method comprises, after the step of decreasing the holding force of the magnet, increasing again the holding force of the magnet by moving the slide towards the uppermost metal sheet. This ensures that the metal sheets remain attached to the magnet while the magnet with the predetermined number of metal sheets is moved from one location to the other.

The exemplary embodiments of the invention presented in this text are not interpreted to pose limitations to the applicability of the appended claims. The verb "to comprise" is used in this text as an open limitation that does not exclude the existence of also unrecited features. The features recited in the dependent claims are mutually freely combinable unless otherwise explicitly stated.

The exemplary embodiments presented in this text and their advantages relate by applicable parts to the magnet as well as the method according to the invention, even though this is not always separately mentioned.

DETAILED DESCRIPTION OF THE DRAWINGS

The same reference signs are used of the same or like components in different embodiments.

Figure 1:
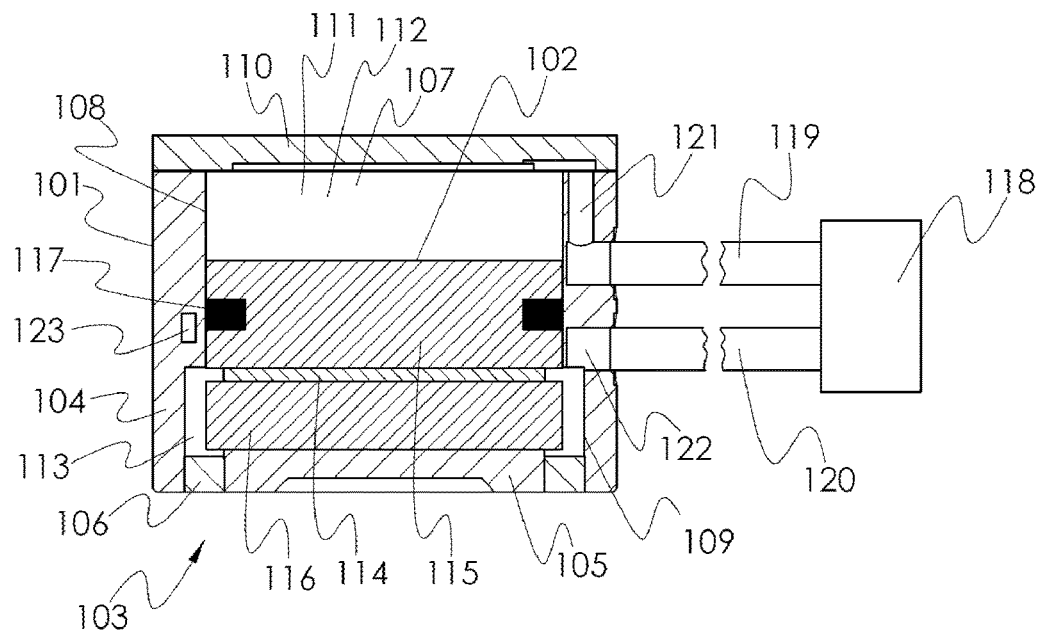
FIG. 1 illustrates a cross-sectional view of a magnet according to a first embodiment of the invention.

FIG. 1 illustrates a cross-sectional view of a magnet according to a first embodiment of the invention. The magnet comprises a body 101 and a slide 102 that is arranged to be movable relative to the body 101 between a first and a second position. The holding force of the magnet depends on the position of the slide 102. The magnet comprises at its one end an attachment surface 103, which is meant to be arranged in contact with an object to be attached (not shown in FIG. 1).

The body 101 comprises a first and a second section 104, 105 that are made of magnetic material for conveying magnetic flux to an object to be attached. The first and the second section 104, 105 are attached together with a third section 106 of the body 101, which third section 106 is made of non-magnetic material.

Figure 6:
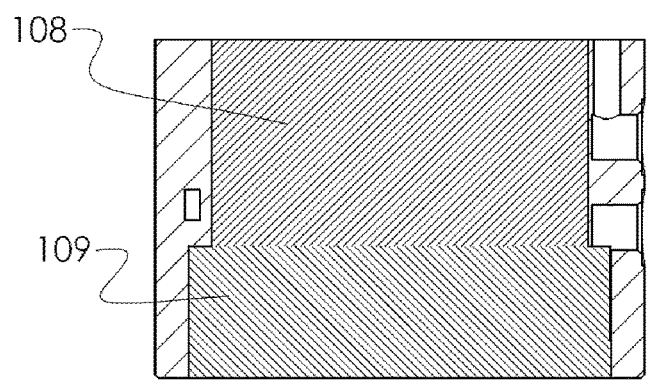
FIG. 6 illustrates in more detail the through hole in the magnet of FIGS. 1 and 2.

The first section 104 comprises a through hole 107 consisting of two cylindrical through hole portions 108, 109. The diameter of the first through hole portion 108 is smaller than the diameter of the second through hole portion 109. The first through hole portion 108 and the second through hole portion 109 are shown in more detail in FIG. 6.

Figure 7:
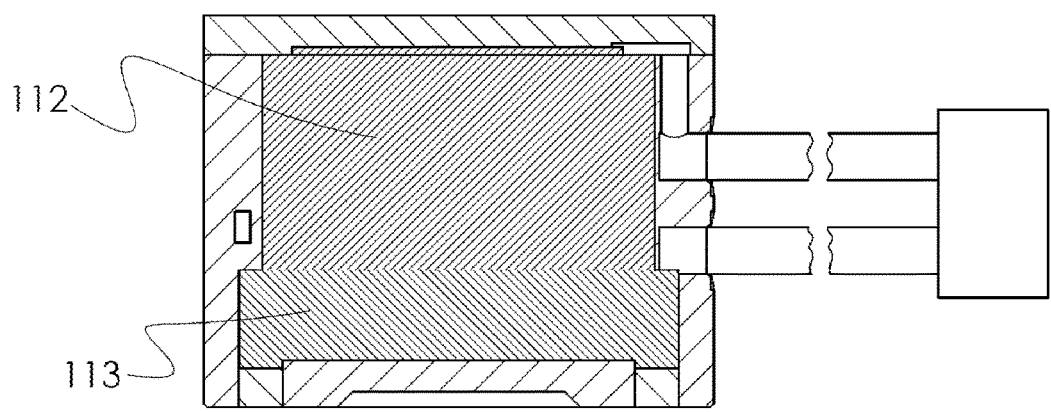
FIG. 7 illustrates in more detail the cavity in the magnet of FIGS. 1 and 2.

The first end of the through hole 107 is closed by a fourth section 110 of the body 101 made of non-magnetic material and the second end of the through hole 107 is closed by the second and the third section 105, 106 of the body 101, so that a cavity 111 consisting of a first cavity portion 112 and a second cavity portion 113 is formed inside the body 101. The second section 105 and the third section 106 are located inside the second through hole portion 109. The cylindrical second section 105 is attached by the ring-shaped third section 106 to the wall of the second through hole portion 109. The first cavity portion 112 and the second cavity portion 113 are shown in more detail in FIG. 7.

The slide 102 is cylindrical and comprises a permanent magnet 114, and a first and a second pole piece 115, 116 that are attached to opposite magnetic pole surfaces of the permanent magnet 114. The slide 102 also comprises a sealing ring 117 that is mounted in a groove in the first pole piece 115. The sealing ring 117 is attached to the first pole piece 115 in such a position that the sealing ring 117 stays inside the first through hole portion 108. The slide 102 is movably arranged inside the cavity 111 in such a manner that part of the first pole piece 115 always stays inside the first through hole portion 108. The second pole piece 116 is directed towards the second section 105.

The slide 102 is moved relative to the body 101 by conveying liquid into and out of the first and the second cavity portion 112, 113. When liquid is supplied into the first cavity portion 112 and exhausted from the second cavity portion 113, the slide 102 moves towards the second position. When liquid is supplied into the second cavity portion 113 and exhausted from the first cavity portion 112, the slide 102 moves towards the first position.

The liquid is conveyed into and out of the first and the second cavity portion 112, 113 using a hydraulic system 118 that is coupled via a first and a second pipe 119, 120 to a first and a second conduit 121, 122 that are integrated into the body 101. The first end of the first conduit 121 is arranged in communication with the first cavity portion 112 through the fourth section 110 that closes the first end of the through hole 107. The first end of the second conduit 122 is arranged in communication with the second cavity portion 113 through the wall of the second through hole portion 109. The position of the slide 102 is determined with a magnetic flux sensor 123 that is arranged inside the first section 104, close to the first through hole portion 108.

Figure 2:
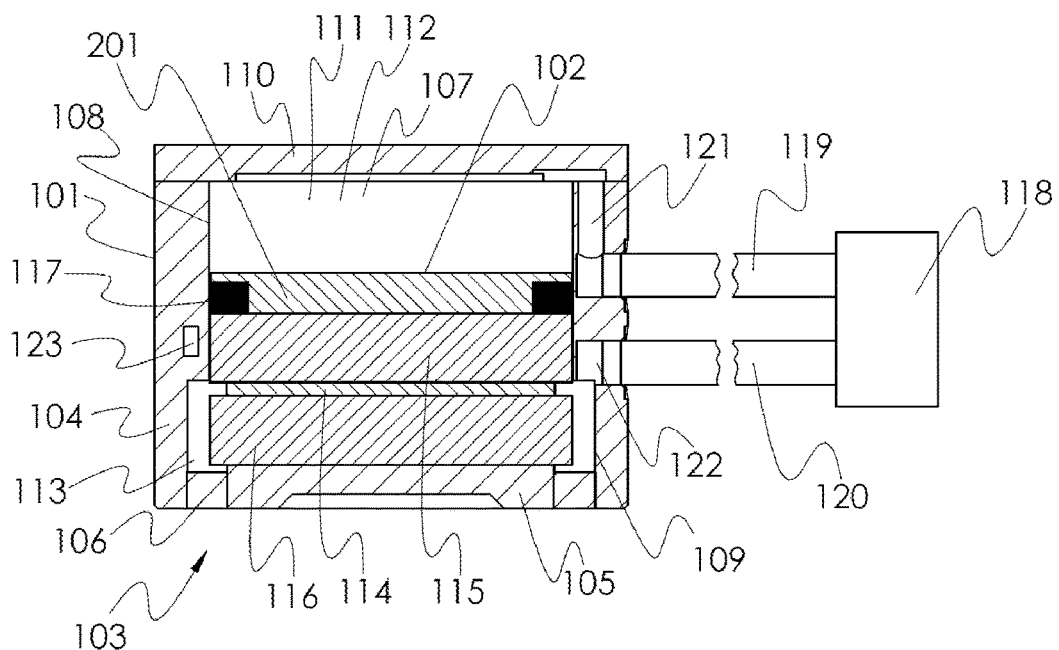
FIG. 2 illustrates a cross-sectional view of a magnet according to a second embodiment of the invention.

FIG. 2 illustrates a cross-sectional view of a magnet according to a second embodiment of the invention. The magnet of FIG. 2 differs from the magnet of FIG. 1 in that the slide 102 comprises a cap 201 attached on top of the first pole piece 115 for holding the sealing ring 117.

Figure 3:
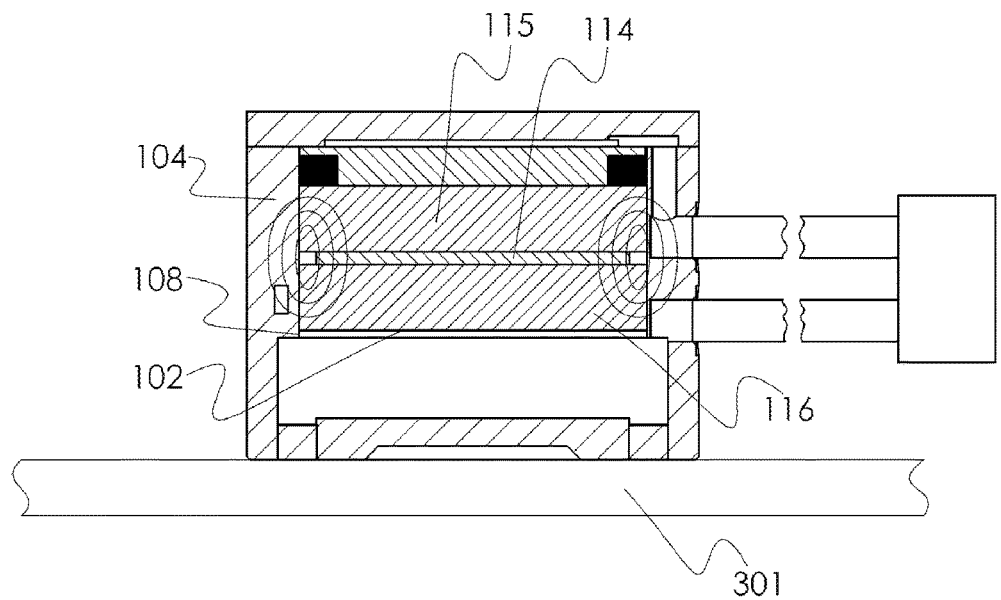
FIGS. 3-5 illustrate the magnetic field of the magnet of FIG. 2 at three different positions of the slide.

FIG. 3 illustrates the magnetic field generated by the magnet of FIG. 2, when the slide 102 is at the first position. The slide 102 is located inside the first through hole portion 108, whereby essentially all of the magnetic flux (illustrated with magnetic field lines) generated by the permanent magnet 114 passes from the first pole piece 115 to the second pole piece 116 through a portion of the first section 104 that surrounds the first through hole portion 108. The first section 104 thus short-circuits the magnetic flux generated by the permanent magnet 114. As a result of this, the holding force of the magnet is very small, and therefore the magnet cannot attach to a metal sheet 301.

Figure 4:
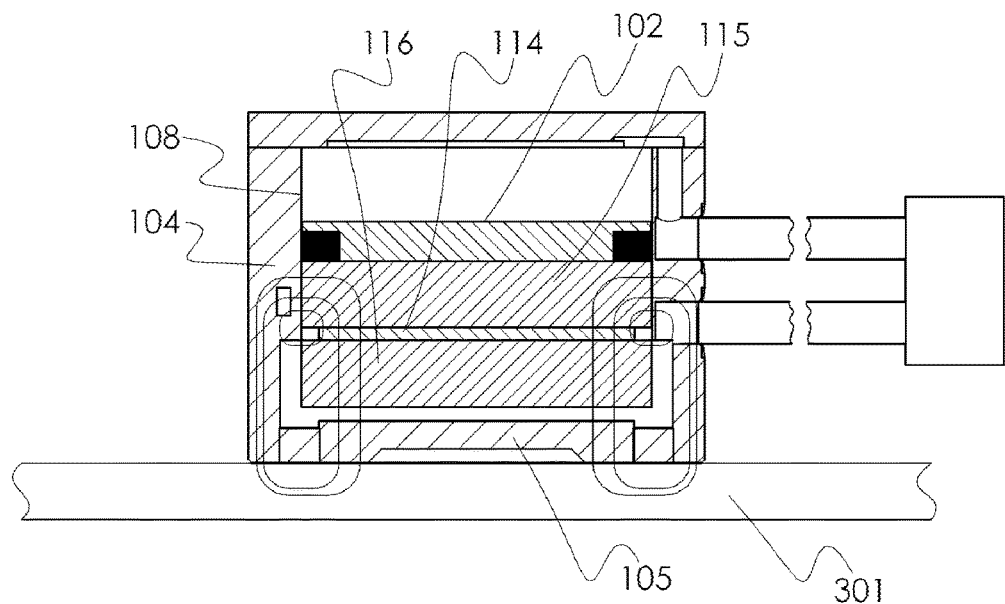

FIG. 4 illustrates the magnetic field generated by the magnet of FIG. 2, when the slide 102 is at an intermediate position. The first pole piece 115 and the permanent magnet 114 are located inside and the second pole piece 116 is located outside the first through hole portion 108, whereby part of the magnetic flux (illustrated with magnetic field lines) generated by the permanent magnet 114 passes from the first pole piece 115 to the second pole piece 116 through a portion of the first section 104 that surrounds the first through hole portion 108, and part of the magnetic flux passes from the first pole piece 115 through the first section 104 to the metal sheet 301 and therefrom through the second section 105 to the second pole piece 116. As a result of this, the magnet is weakly attached to the metal sheet 301.

Figure 5:
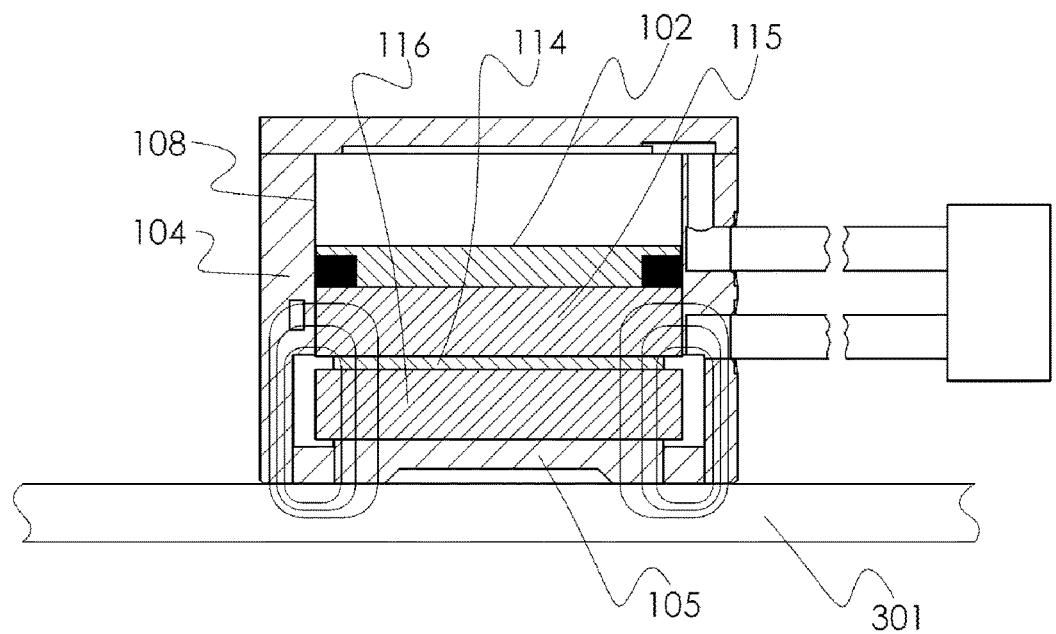

FIG. 5 illustrates the magnetic field generated by the magnet of FIG. 2, when the slide 102 is at the second position. The second pole piece 116 is in contact with the second section 105 and only part of the first pole piece 115 is located inside the first through hole portion 108, whereby essentially all of the magnetic flux (illustrated with magnetic field lines) generated by the permanent magnet 114 passes from the first pole piece 115 through the first section 104 to the metal sheet 301 and therefrom through the second section 105 to the second pole piece 116. As a result of this, the holding force of the magnet is large, and therefore the magnet is tightly attached to the metal sheet 301.

Only advantageous exemplary embodiments of the invention are described in the figures. It is clear to a person skilled in the art that the invention is not restricted only to the examples presented above, but the invention may vary within the limits of the claims presented hereafter. Some possible embodiments of the invention are described in the dependent claims, and they are not to be considered to restrict the scope of protection of the invention as such.

The invention claimed is:

1. A magnet, comprising:
 a body that comprises a first, a second, a third and a fourth sections, wherein the first and the second sections are made of magnetic material for directing magnetic flux to an object to be attached, the first and the second section being separated and attached to the third section of the body, which third section is made of non-magnetic material, and
 a slide that comprises a permanent magnet, and a first and a second pole piece attached to opposite magnetic pole surfaces of the permanent magnet, and the slide being arranged to be movable relative to the body between a first and a second position in order to alter path of the magnetic flux generated by the permanent magnet;
 wherein:
 the first section comprises a through hole having a first and a second end and a first and a second through hole portion, both through hole portions having a diameter, and the diameter of the first through hole portion being smaller than the diameter of the second through hole portion,
 the first end of the through hole being closed by the fourth section of the body and the second end of the through hole being closed by the second and the third sections of the body, so that a cavity consisting of a first and a second cavity portion is formed inside the body,
 the slide being arranged inside the cavity so as to be movable in longitudinal direction of the through hole, the first pole piece being directed towards the first end of the through hole, and the magnet comprises means for transferring a medium into and out of the first and the second cavity portions in order to move the slide;
 and wherein at the first position of the slide, the permanent magnet, at least part of the first pole piece and at least part of the second pole piece are located inside the first through hole portion, and at the second position of the slide, at least part of the first pole piece is located inside the first through hole portion and the second pole piece is located outside the first through hole portion.

2. The magnet according to claim 1, wherein the first through hole portion and the first pole piece are cylindrical.

3. The magnet according to claim 2, wherein the second pole piece is cylindrical.

4. The magnet according to claim 3, wherein the permanent magnet is cylindrical and diameter of the permanent magnet is smaller than diameter of the first pole piece and diameter of the second pole piece.

5. The magnet according to claim 1, wherein thickness of the permanent magnet is smaller than thickness of the first pole piece and thickness of the second pole piece.

6. The magnet according to claim 1, wherein the second through hole portion is cylindrical.

7. The magnet according to claim 6, wherein the third section is a hollow cylinder attached to a wall of the second through hole portion, and the second section is attached to an inner wall of the third section.

8. The magnet according to claim 7, wherein inner diameter of the third section is same or larger than diameter of the first through hole portion, and height of the third section is larger than height of the second section.

9. The magnet according to claim 1, wherein the second and the third section are located inside the second through hole portion.

10. The magnet according to claim 1, wherein the third section extends from the second end of the through hole to the first through hole portion.

11. The magnet according to claim 1, wherein the first section and the fourth section form an integral structure.

12. The magnet according to claim 1, wherein the magnet comprises a sealing ring attached around the slide or attached to a wall of the first through hole portion.

13. The magnet according to claim 12, wherein the sealing ring is attached to a groove in the first pole piece.

14. The magnet according to claim 12, wherein the slide comprises a cap attached on top of the first pole piece for holding the sealing ring in place.

15. The magnet according to claim 1, wherein the means for transferring a medium into and out of the first and the second cavity portion comprises a first and a second conduit integrated into the body, a first end of the first conduit being in communication with the first cavity portion and a first end of the second conduit being in communication with the second cavity portion.

16. The magnet according to claim 15, wherein a second end of the first conduit and a second end of the second conduit open outside the magnet.

17. The magnet according to claim 15, wherein the means for transferring a medium into and out of the first and the second cavity portion comprises a pneumatic or a hydraulic system coupled to the second end of the first conduit and the second end of the second conduit.

18. The magnet according to claim 1, wherein the magnet comprises a medium that is gas or liquid.

19. The magnet according to claim 1, wherein the magnet comprises:
    a magnetic flux sensor configured to measure magnetic flux density in the first section, and
    means for determining the position of the slide based on the measured magnetic flux density.

20. The magnet according to claim 19, wherein the magnetic flux sensor is one of the following: a Hall sensor, an AMR magnetometer, a MEMS sensor or a reed relay.

21. A method for handling metal sheets, wherein the method comprises the steps of:
    placing the magnet according to claim 1 on an uppermost metal sheet of a stack of metal sheets,
    increasing holding force of the magnet by moving the slide towards the uppermost metal sheet,
    lifting the magnet, and
    decreasing the holding force of the magnet by moving the slide away from the uppermost metal sheet until a predetermined number of metal sheets remains attached to the magnet.

22. The method according to claim 21, wherein after decreasing the holding force of the magnet, the method comprises a step of again increasing the holding force of the magnet by moving the slide towards the uppermost metal sheet.

* * * * *